(12) United States Patent
Lee

(10) Patent No.: US 8,383,477 B2
(45) Date of Patent: Feb. 26, 2013

(54) SEMICONDUCTOR DEVICE INCLUDING VERTICAL TRANSISTOR AND METHOD FOR MANUFACTURING THE SAME

(75) Inventor: Kyoung Han Lee, Icheon (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/976,792

(22) Filed: Dec. 22, 2010

(65) Prior Publication Data

US 2012/0012913 A1 Jan. 19, 2012

(30) Foreign Application Priority Data

Jul. 13, 2010 (KR) .................. 10-2010-0067333

(51) Int. Cl.
*H01L 21/8238* (2006.01)
*H01L 21/8242* (2006.01)
(52) U.S. Cl. ........ 438/242; 438/212
(58) Field of Classification Search .......... 257/296–331, 257/E29.345, E21.09; 438/212–217, 239–256
See application file for complete search history.

(56) References Cited

U.S. PATENT DOCUMENTS

| 2007/0181925 A1 | 8/2007 | Yoon et al. |
| 2008/0173936 A1* | 7/2008 | Yoon et al. ............ 257/329 |
| 2009/0230466 A1 | 9/2009 | Kim |

FOREIGN PATENT DOCUMENTS

| KR | 1020070009140 A | 1/2007 |
| KR | 100723527 B1 | 5/2007 |

* cited by examiner

*Primary Examiner* — Coung Q Nguyen

(57) ABSTRACT

A semiconductor device including a vertical transistor and a method for manufacturing the same may reduce a cell area in comparison with a conventional layout of 8F2 and 6F2. Also, the method does not require forming a bit line contact, a storage node contact or a landing plug, thereby decreasing the process steps. The semiconductor device including a vertical transistor comprises: an active region formed in a semiconductor substrate; a bit line disposed in the lower portion of the active region; a word line buried in the active region; and a capacitor disposed over the upper portion of the active region and the word line.

17 Claims, 18 Drawing Sheets

(a)

(b)

SEMICONDUCTOR DEVICE INCLUDING VERTICAL TRANSISTOR AND METHOD FOR MANUFACTURING THE SAME

CROSS-REFERENCE TO RELATED APPLICATION

The priority of Korean patent application No. 10-2010-0067333 filed on Jul. 13, 2010, the disclosure of which is hereby incorporated in its entirety by reference, is claimed.

BACKGROUND OF THE INVENTION

An embodiment of the present invention relates to a semiconductor device including a vertical transistor and a method for manufacturing the same.

In general, a semiconductor is a material which belongs to an intermediate region of a conductor and a nonconductor according to classification of materials based on electrical conductivity. Although a semiconductor is similar to a nonconductor in a pure state, the electrical conductivity of the semiconductor changes by addition of impurities or by other manipulations. The semiconductor has been used to produce a semiconductor device such as a transistor by addition of impurities and connection of the conductor. A semiconductor apparatus refers to an apparatus having various functions performed by the semiconductor device. A representative example of the semiconductor apparatus is a semiconductor memory apparatus.

A semiconductor memory apparatus comprises a plurality of unit cells each including a capacitor and a transistor. A double capacitor is used to store data temporarily, and a transistor is used to transfer data between a bit line and a capacitor in response to a control signal (word line) using an electrical conductivity change. A transistor includes three regions such as a gate, a source and a drain. In a transistor, charges between the source and the drain move in response to a control signal. The movement of charges between the source and the drain is performed through a channel region which has the property of the semiconductor.

When a general transistor is formed in a semiconductor substrate, a gate is formed in the semiconductor substrate, and impurities are doped at both sides of the gate so as to form a source and a drain. In this case, a space between the source and the drain under the gate is a channel region of the transistor. A transistor having a vertical channel region occupies given area of the semiconductor substrate. In case of a complicated semiconductor memory apparatus, it is difficult to reduce a unit cell area because the number of transistors included in a unit cell increases.

If a unit cell area of a semiconductor apparatus is reduced, it is possible to increase the number of net die per wafer, thereby improving productivity. In order to reduce a unit cell area of a semiconductor memory apparatus, various methods have been suggested. As one of these methods, a 3D transistor is used which includes a vertical transistor having a vertical channel region instead of a conventional planar transistor having a horizontal channel region.

BRIEF SUMMARY OF THE INVENTION

Various embodiments of the invention are directed to a semiconductor device including a vertical transistor and a method for manufacturing the same that may reduce a cell area in comparison with a conventional layout of 8F2 and 6F2. Also, the method does not require forming a bit line contact, a storage node contact or a landing plug, thereby decreasing the process steps.

According to an embodiment of the present invention, a semiconductor device including a vertical transistor comprises: an active region formed in a semiconductor substrate; a bit line disposed in a lower portion of the active region; a word line buried in the active region; and a capacitor disposed on an upper portion of the active region and being coupled to the bit line via the active region. As a result, the semiconductor device may reduce a cell area in comparison with a conventional layout of 8F2 and 6F2. Also, the method does not require forming a bit line contact, a storage node contact or a landing plug, thereby decreasing the process steps.

The word line and the active region are in contact and defining a step difference, thereby maximizing a channel area. The surface contacting with the word line and the active region is straight-line.

The cross-sectional shape of the word line is rectangular or oval. The active region has a rectangular pillar shape or a cylindrical column shape.

The semiconductor device further comprises a storage node contact coupled between the upper portion of the active region and the lower portion of the capacitor.

The word line is buried in the middle part of the active region or at one sidewall of the active region so that a channel is formed at one side or at both sides. An upper side end portion of the word line extends to a level lower than an upper side end portion of the active region, thereby maximizing the area contacting with the active region and the lower electrode of the capacitor.

The bit line and the word line are extended in a perpendicular direction from each other. The semiconductor device further comprises a first insulating film disposed between the active regions, thereby insulating a space between the active regions.

The semiconductor device further comprises a word line insulating film including an oxide film disposed between the active region and the word line. The bit line includes any of a metal material such as tungsten (W) or an ion-implanting region.

The semiconductor device further comprises an second insulating film between the word line and the capacitor. And the semiconductor device may further comprise an protective film disposed between the active region and the first insulating film, and disposed parallel with the bit line.

According to an embodiment of the present invention, a method for manufacturing a semiconductor device including a vertical transistor comprises: forming an active region in a semiconductor substrate; forming a bit line in a lower portion of the active region; forming a word line below an upper surface of the active region; and forming a capacitor over an upper portion of the active region and the word line to be coupled to the bit line via the active region. The method may reduce a cell area in comparison with a conventional layout of 8F2 and 6F2. Also, the method does not require forming a bit line contact, a storage node contact or a landing plug, thereby decreasing the process steps. Additionally, the method reduces parasitic capacitance between the word line and the bit line.

The forming-the-word-line-in-the-active-region includes etching the semiconductor substrate including the active region so as to have a step difference, thereby maximizing a channel area.

The forming-the-word-line-in-the-active-region includes etching the cross-sectional view of the active region so as to have a rectangular or oval shape. The forming-an-activeregion-in-the-semiconductor-substrate includes etching the active region so as to have a rectangular pillar shape or a cylindrical column shape.

Before forming the capacitor, the method further comprises forming a storage node contact on the upper portion of the active region and the word line, thereby enhancing the electric connection between the capacitor and the active region.

The forming-the-word-line-in-the-active-region includes: etching a middle part or one sidewall region of the active region including the bit line; and burying a word line material in the etched active region.

The forming-the-word-line-in-the-active-region includes: etching a portion of the active region including the bit line; burying a word line material in the etched active region; and etching a portion of the buried word line material so that the upper side end portion of the word line extends to a level lower than an upper side end portion of the active region, thereby maximizing the contact area of the lower electrode and the active region of the capacitor.

The word line is formed perpendicular to the bit line. After forming a word line in the active region, the method further comprises forming a second insulating film between the word line and the capacitor, thereby insulating a space between the active regions.

After forming the bit line, the method further comprises depositing a first insulating film between neighboring active regions. Before forming the word line, the method further comprises forming a word line insulating film including an oxide film between the active region and the word line.

The forming-a-bit-line-in-the-lower-portion-of-the-active-region includes: forming a protective film over the active region; forming an sacrificial film over the protective film; patterning the protective film and the sacrificial film between the active regions to form a first recess; patterning the lower portion of the first recess to form a bulb-like recess extended from the first recess; filling a bit line material in the bulb-type recess to form a bulb-like bit line; forming a second recess passing through the bulb-like bit line sot that the recess forms two electrically separated bit lines; and forming an insulating film in the second recess.

DESCRIPTION OF EMBODIMENTS

The present invention will be described in detail with reference to the attached drawings.

Figure 1:
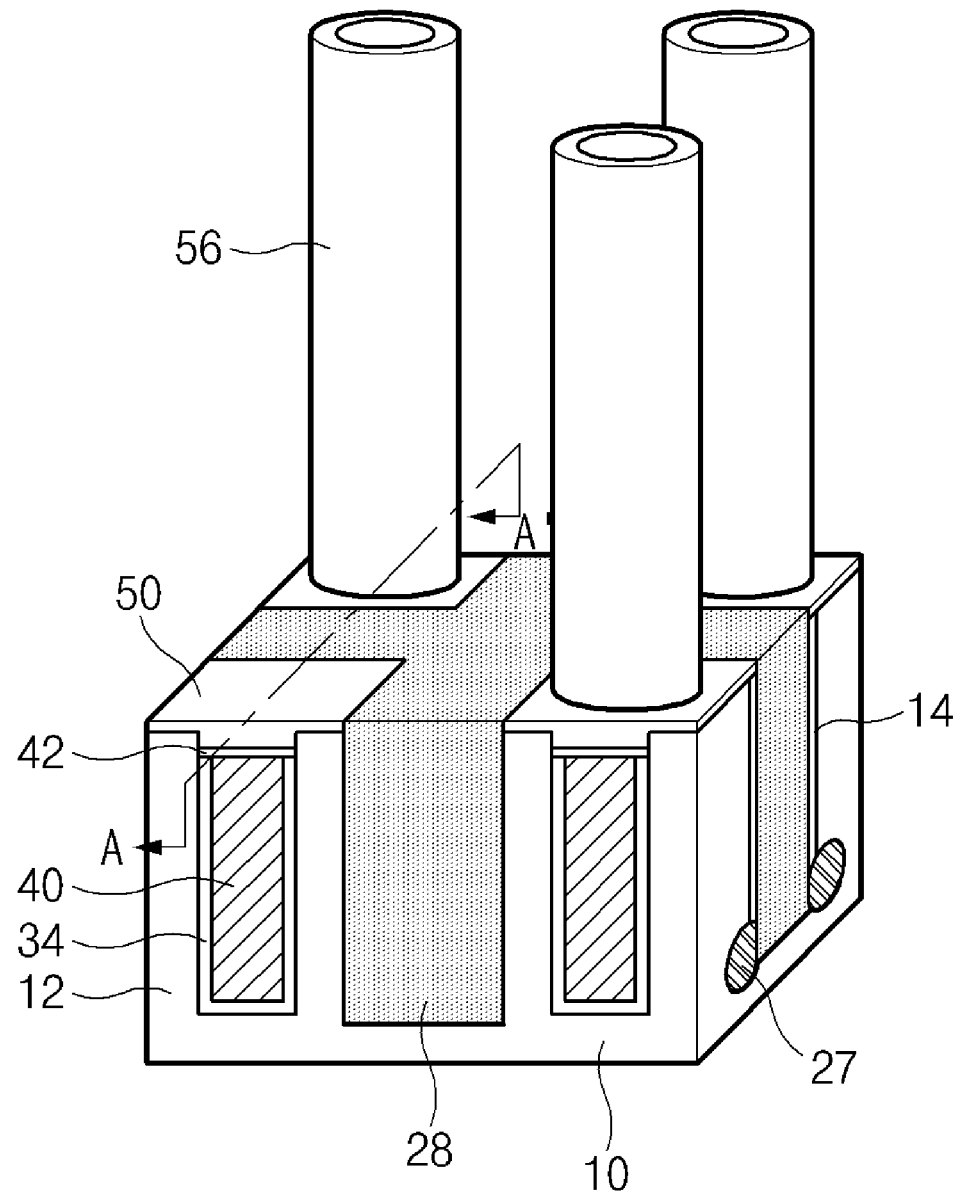
FIGS. 1 and 2 are perspective views illustrating a semiconductor device including a vertical transistor according to an embodiment of the present invention.
Figure 2:
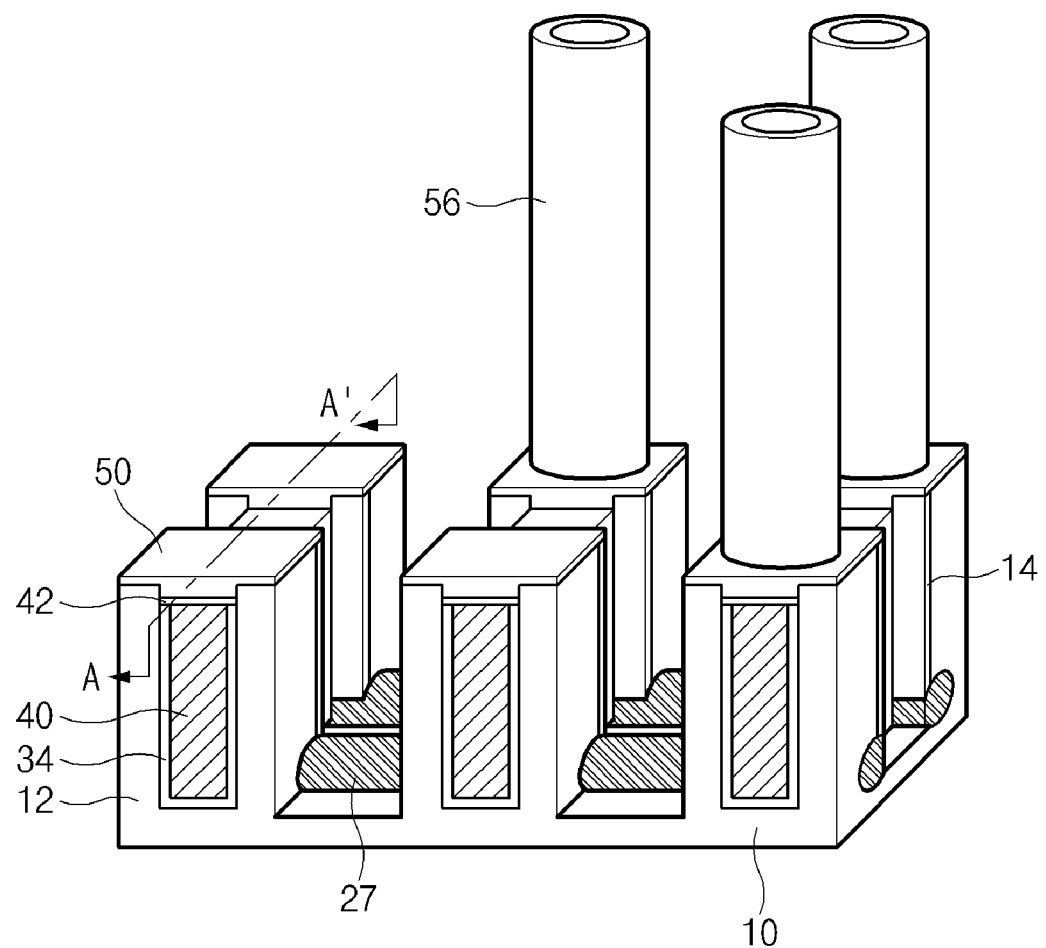

FIGS. 1 and 2 are perspective views illustrating a semiconductor device including a vertical transistor according to an embodiment of the present invention. FIG. 2 shows the semiconductor device of FIG. 1 with a first insulating film omitted.

Referring to FIG. 1, a semiconductor device including a vertical transistor comprises a plurality of active regions 12 in a pillar shape and separated by a first insulating film 28 from one another. In a direction taken along A-A', a word line 40 is formed penetrating the plurality of active regions 12 or extending inside of the plurality of active regions 12 to be in a buried shape. A word line insulating film 34 including an insulating material such as an oxide film is formed between the word line 40 and the active region 12. A bottom surface of a lower electrode 50 is formed on the upper portion of the word line 40 in each active region 12. A capacitor 56 including the lower electrode 50 is disposed thereon.

Referring to FIG. 2, a bit line 27 is extended in the lower portion of the active region 12 in a perpendicular direction of the word line 40.

In the semiconductor device including a vertical transistor according to an embodiment of the present invention, the word line 40 is not formed outside of the active region 12, for example, over the active region 12. Instead, the word line 40 is formed inside of the active region 12 or formed penetrating the active region 12, thereby reducing the cell area and also decreasing parasitic capacitance generated between the word line 40 and the bit line 27.

Figure 3A:
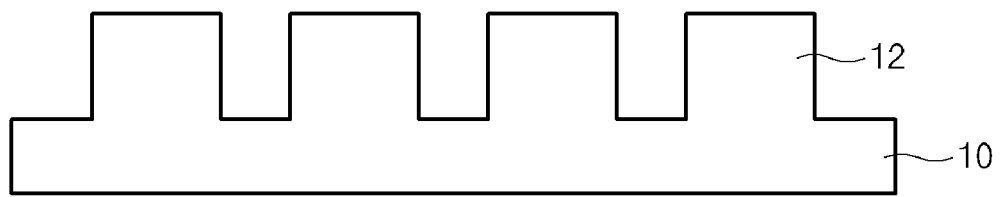
FIGS. 3a to 3q are cross-sectional views illustrating a method for manufacturing a semiconductor device including a vertical transistor according to an embodiment of the present invention.
Figure 3B:
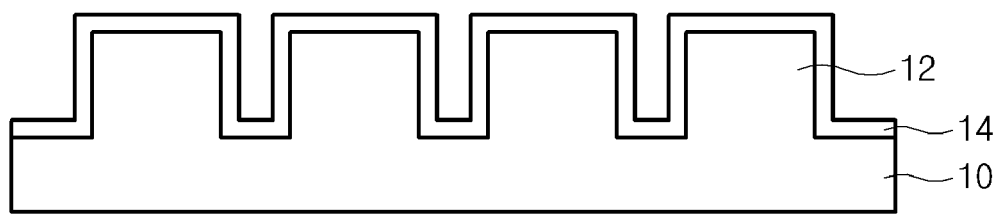
Figure 3C:
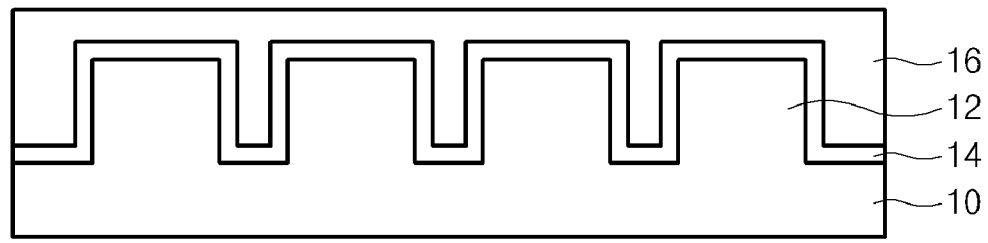
Figure 3D:
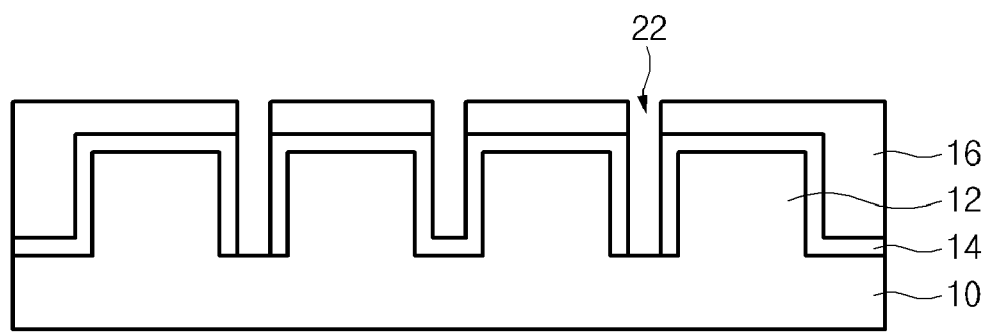
Figure 3E:
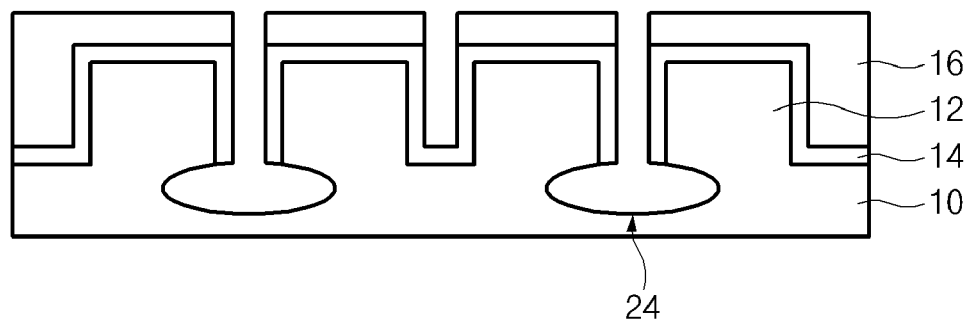
Figure 3F:
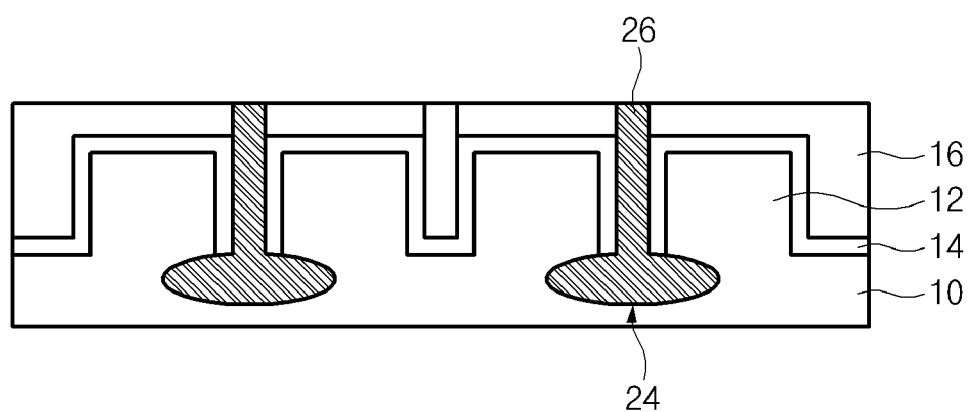
Figure 3G:
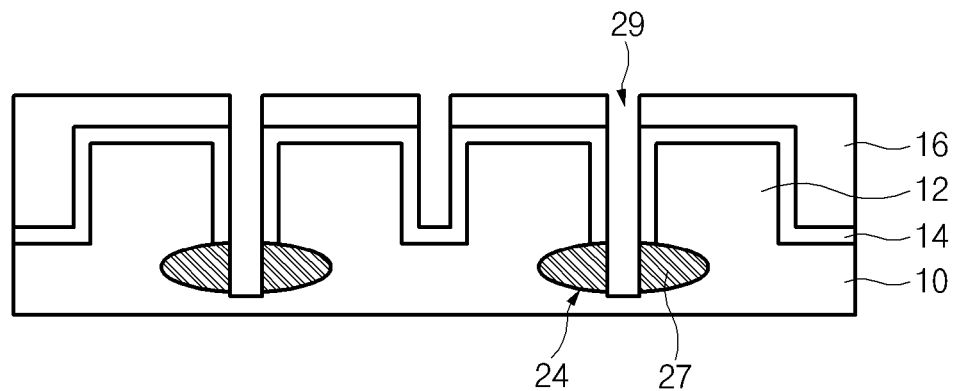
Figure 3H:
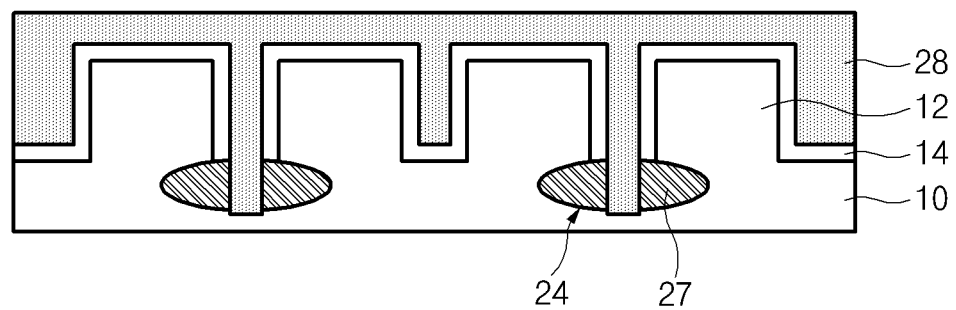
Figure 3I:
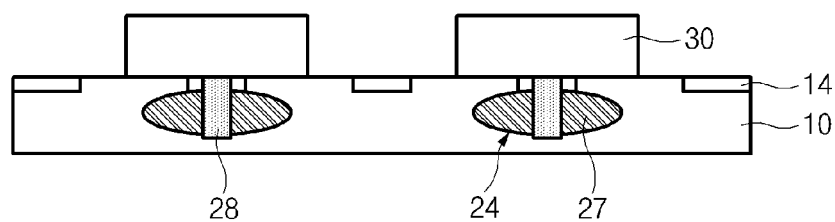
Figure 3J:
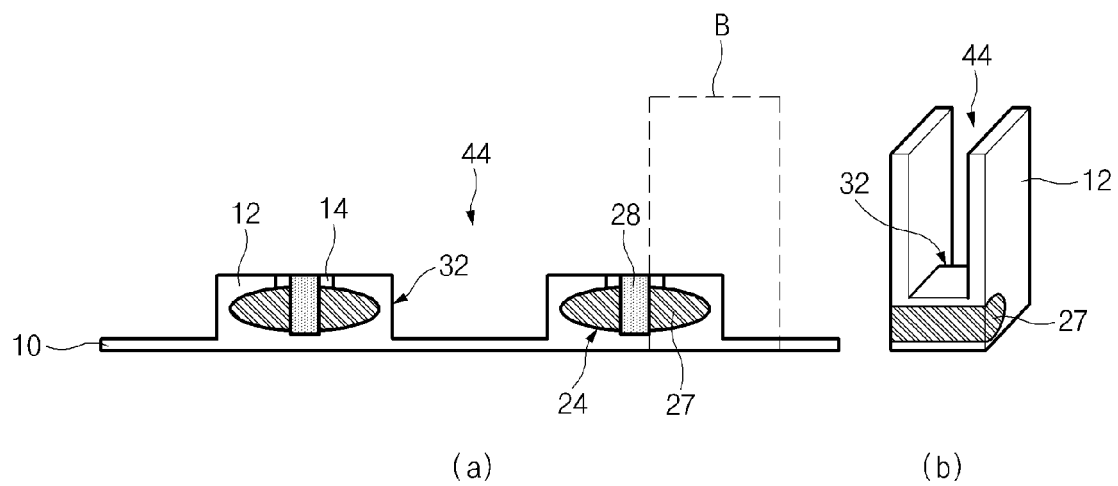
Figure 3K:
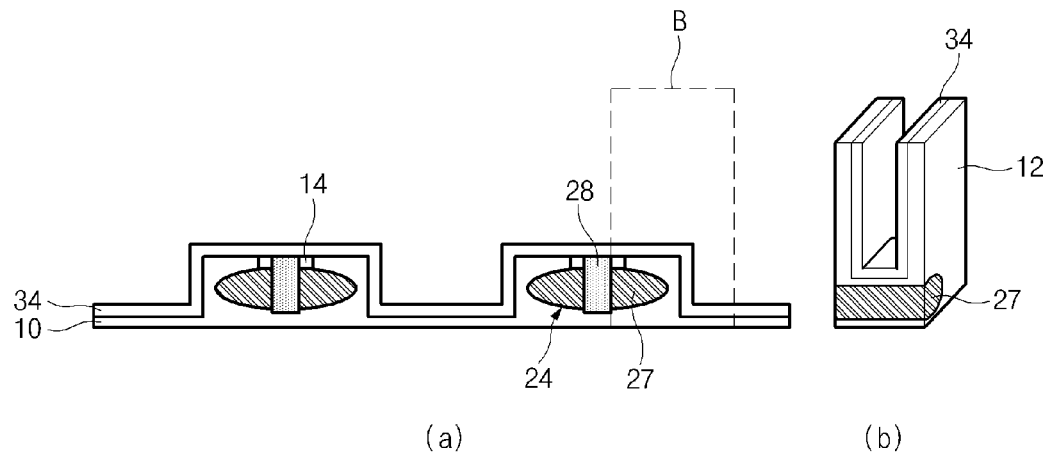
Figure 3L:
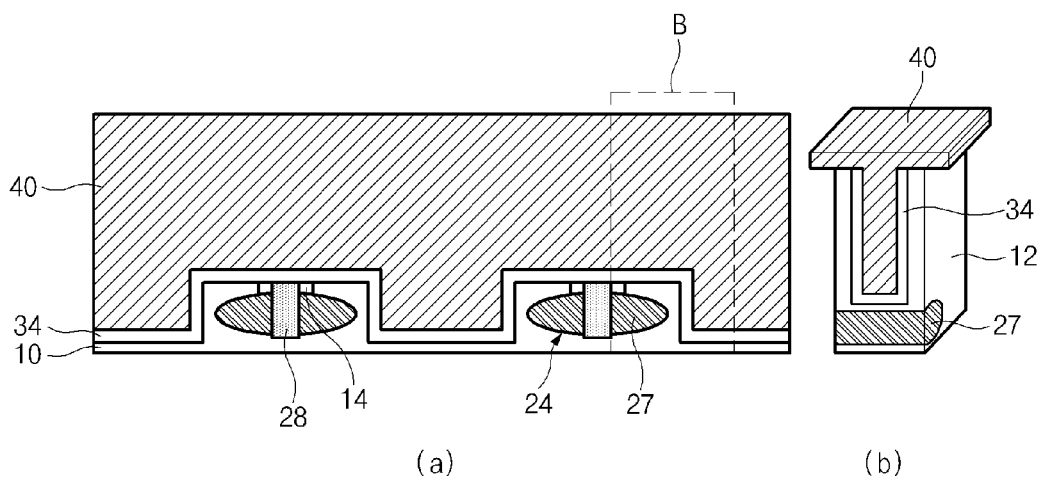
Figure 3M:
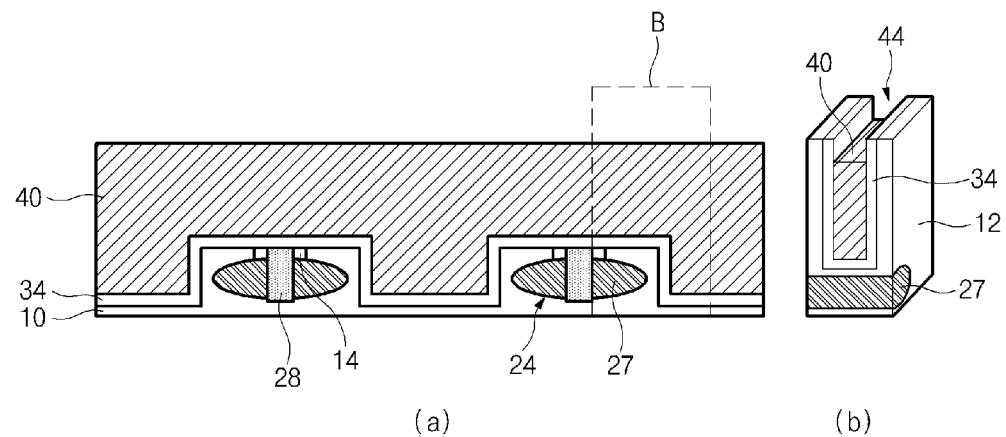
Figure 3N:
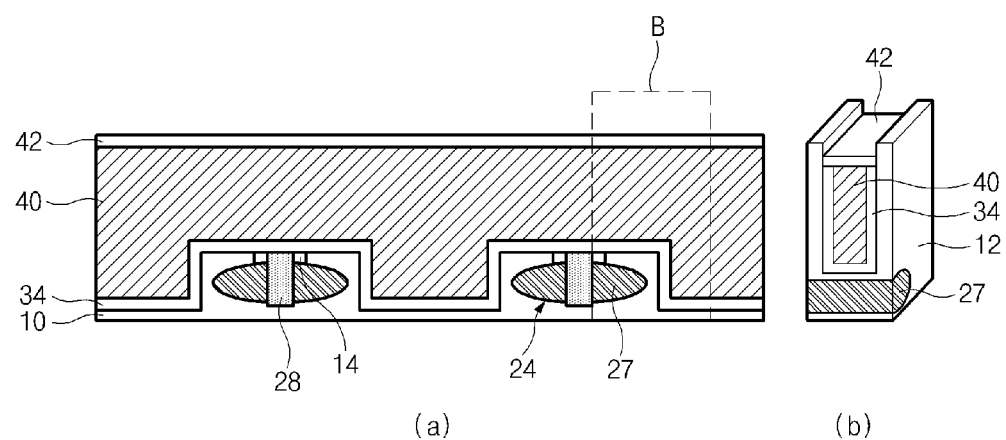
Figure 3O:
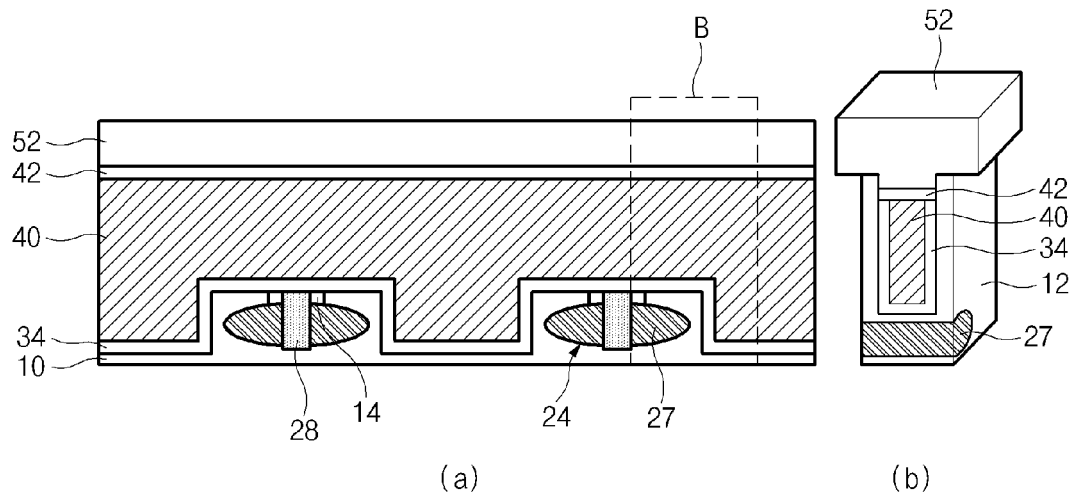
Figure 3P:
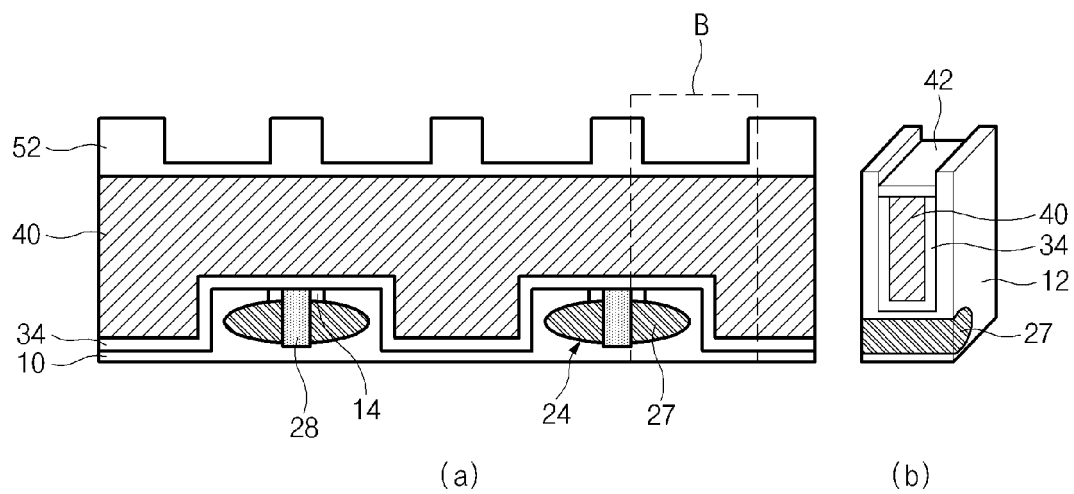
Figure 3Q:
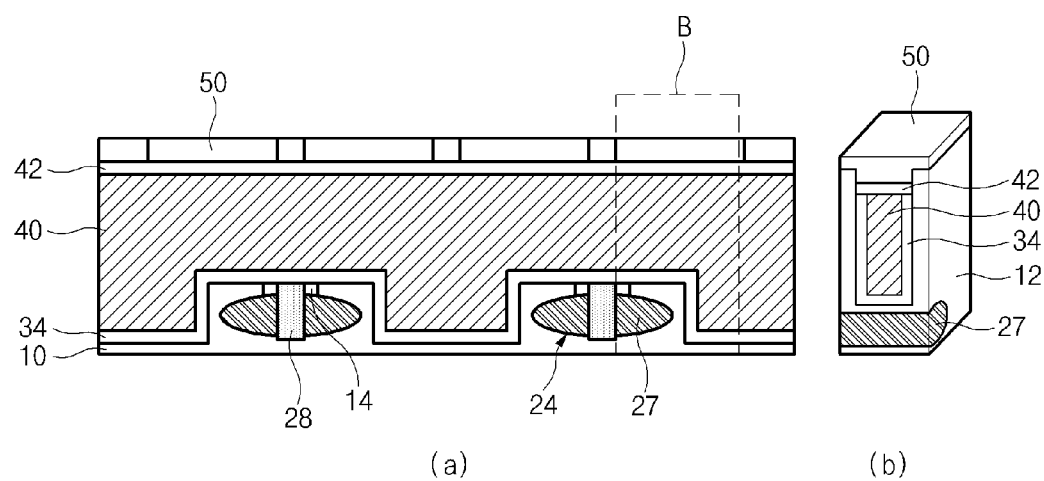

FIGS. 3a to 3q are cross-sectional views illustrating a method for manufacturing a semiconductor device including a vertical transistor according to an embodiment of the present invention, taken along A-A' of FIGS. 1 and 2.

As shown in FIG. 3a, after a mask (not shown) is formed on a semiconductor substrate 10, the semiconductor substrate 10 is etched with the mask to form an active region 12. Referring to FIG. 3b, a protective film 14 is formed on the surface of the semiconductor substrate 10. The protective film 14 includes an insulating material such as an oxide film and is formed, for example, by a physical vapor deposition (PVD) method.

Referring to FIG. 3c, a sacrificial film 16 is formed over the entire surface of the semiconductor substrate 10 including the protective film 14. The sacrificial film 16 is a material for protecting the active region 12 from a subsequent etching process. The sacrificial film 16 includes any of an oxide film and a nitride film.

As shown in FIG. 3d, the sacrificial film 16 disposed between the two active regions 12 is etched until the substrate 10 is exposed to form a first recess 22. The first recess 22 is required to form a bit line 27 (see FIG. 3g). The etching process for forming the first recess 22 is performed with the semiconductor substrate 10 as an etch target to remove the protective film 14 and a sacrificial film 16 located between the active regions 12.

Referring to FIG. 3e, a wet etching process is performed onto the first recess 22 to form a bulb-type recess 24 extended downward from the first recess 22. In the wet etching process, the protective film 14 that remains at a sidewall of the first recess 22 can serve as a mask protecting a sidewall of the active region 12 from being attacked.

Referring to FIG. 3f, a bit line material 26 is deposited over the entire surface of the semiconductor substrate so that the bit line material 26 fills in the first recess 22 and the bulb-type recess 24. The bit line material 26 disposed on the upper portion of the sacrificial film 16 is planarized and removed. FIG. 3f shows the device after the removal step. Alternatively, the bit line material 26 includes a metal material such as tungsten W. The bit line can be formed not by a method of filling in a metal material into the first recess 22 and the bulb-type recess 24 but by an ion-implanting method to form an ion-implantation region in the substrate 10.

Referring to FIG. 3g, a region where the first recess 22 is located is re-etched until the substrate 10 is exposed to form a second recess 29. The bit line material 26 in the bulb-type recess 24 is divided into two parts, each of which forms a bit line 27. The second recess 29 forms a gap through the middle of bit line material 26. As shown in FIG. 3h, the first insulating film 28 is deposited on the entire surface of the semiconductor substrate and fills in the second recess 29, thereby electrically isolating the separated bit lines 27 from each other.

Referring to FIG. 3i, the bit line insulating film 28, the protective film 14 and the active region 12 are etched along a horizontal direction (A-A' direction of FIG. 1) which is perpendicular to the bit line 27 so as to form a first word line recess (not shown). A step-forming mask 30 is formed on the upper portion of the active region 10 and the first insulating film 28. The step-forming mask 30 is formed with a photoresist film or with a hard mask including a nitride film or an amorphous carbon layer. The step-forming mask 30 is formed over a bit line 27 and the first insulating film 28. The step-forming mask 30 is a mask for providing a step difference 32 (see FIG. 3j) in the lower portion of the active region 12 so that a step difference may be formed in the lower end portion of the word line 40 (see FIG. 3i). One of skill in the art will appreciate that the step difference can be formed by a method other than using step-forming mask 30 in other embodiments of the present invention.

As shown in (a) of FIG. 3j, the substrate 10 is etched by using the step-forming mask 30 as an etching mask, thereby forming a second word line recess 44 having a step difference 32 between neighboring bit lines 27.

FIGS. 3j (b) to 3q (b) is a perspective view illustrating a region 'B' of FIGS. 3j (a) to 3q (a).

Referring to FIG. 3k, a word line insulating film 34 is deposited on the substrate 10 including the second word line recess 44 with the step difference 32 so that the substrate 10 formed of the active region 12 is not in direct contact with a word line 40 (see FIG. 3i). The word line insulating film 34 may include an oxide film.

As shown in FIG. 3i, a word line 40 material is deposited on the entire surface of the semiconductor substrate 10 including the word line insulating film 34. The word line 40 includes a metal material such as tungsten (W) or titanium (Ti) and a conductive material such as polysilicon.

Referring to FIG. 3m, the upper portion of the word line 40 is etched by an etch-back process or planarized by a Chemical Mechanical Polishing (CMP) process so as to remove the word line 40 material located at the upper portion of the word line insulating film 34 (it is possible to further remove the word line material so that word line 40 may be formed lower than the upper portion of the word line insulating film, and an upper portion of the word line recess 44 remains empty), thereby separating neighboring word lines 40.

Referring to FIG. 3n, a second insulating film 42 including an insulating film such as an oxide film is formed on the upper portion of the word line 40.

As shown in FIG. 3o, a storage node insulating film 52 is deposited on the upper portion of the second insulating film 42 and the word line insulating film 34. As shown in FIG. 3p, a region is etched which is reserved for a lower storage electrode 50 (see FIG. 3q). The storage node insulating film 52 is etched using the second insulating film 42 as an etch target until the surface of the second insulating film 42 is exposed (see FIG. 3q).

Referring to FIG. 3q, a lower storage electrode 50 is formed over the exposed second insulating film 42. A dielectric film and an upper storage electrode are formed on the upper portion of the lower electrode 50, thereby obtaining a capacitor 56 shown in FIGS. 1 and 2. The capacitor 56 may be in various kinds of structures such as a concave type, a cylinder type and a pillar type.

By the above-described method shown in FIGS. 3a to 3q, the semiconductor device including a vertical transistor shown in FIGS. 1 and 2 can be formed.

FIGS. 4 to 9 are each illustrating another example of a semiconductor device including a vertical transistor according to an embodiment of the present invention.

Figure 4:
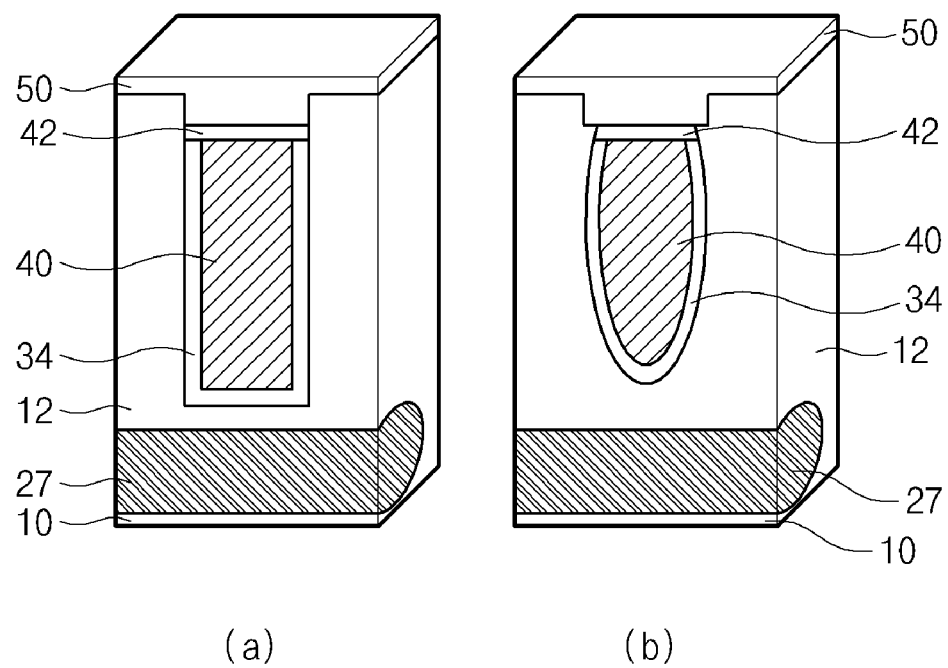
FIGS. 4 to 9 illustrating other embodiments of a semiconductor device including a vertical transistor according to an embodiment of the present invention.

Referring to (b) of FIG. 4 (the embodiment shown in (a) of FIG. 4 is identical to what shown in FIG. 1), the cross-sectional view of the word line 40 buried in the active region 12 may be in a rectangular or in an oval form. It is easier to form the first word line recess where the word line 40 is filled in (see FIG. 3i) in an oval shape as shown in FIG. 4(b) rather than in a rectangular shape as shown in FIG. 4(a).

Figure 5:
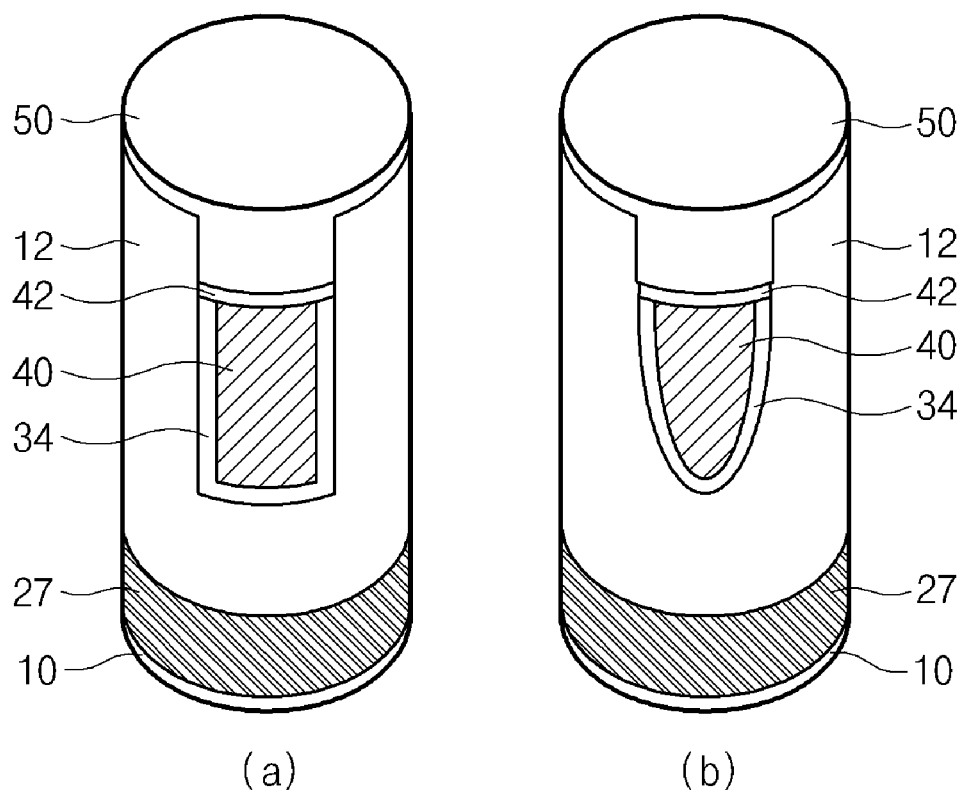

Referring to FIG. 5, the active region 12 may have a rectangular pillar shape or a cylindrical column shape in addition to the rectangular shape shown in FIG. 4. When the active region is formed in a cylindrical column shape, it is easier to etch the substrate 10 (see FIG. 3a) in order to obtain the active region 12. As shown in (b) of FIG. 5, the active region 12 may be formed to have a cylindrical column shape, and the cross-sectional shape of the word line 40 may be formed to be oval.

Figure 6:
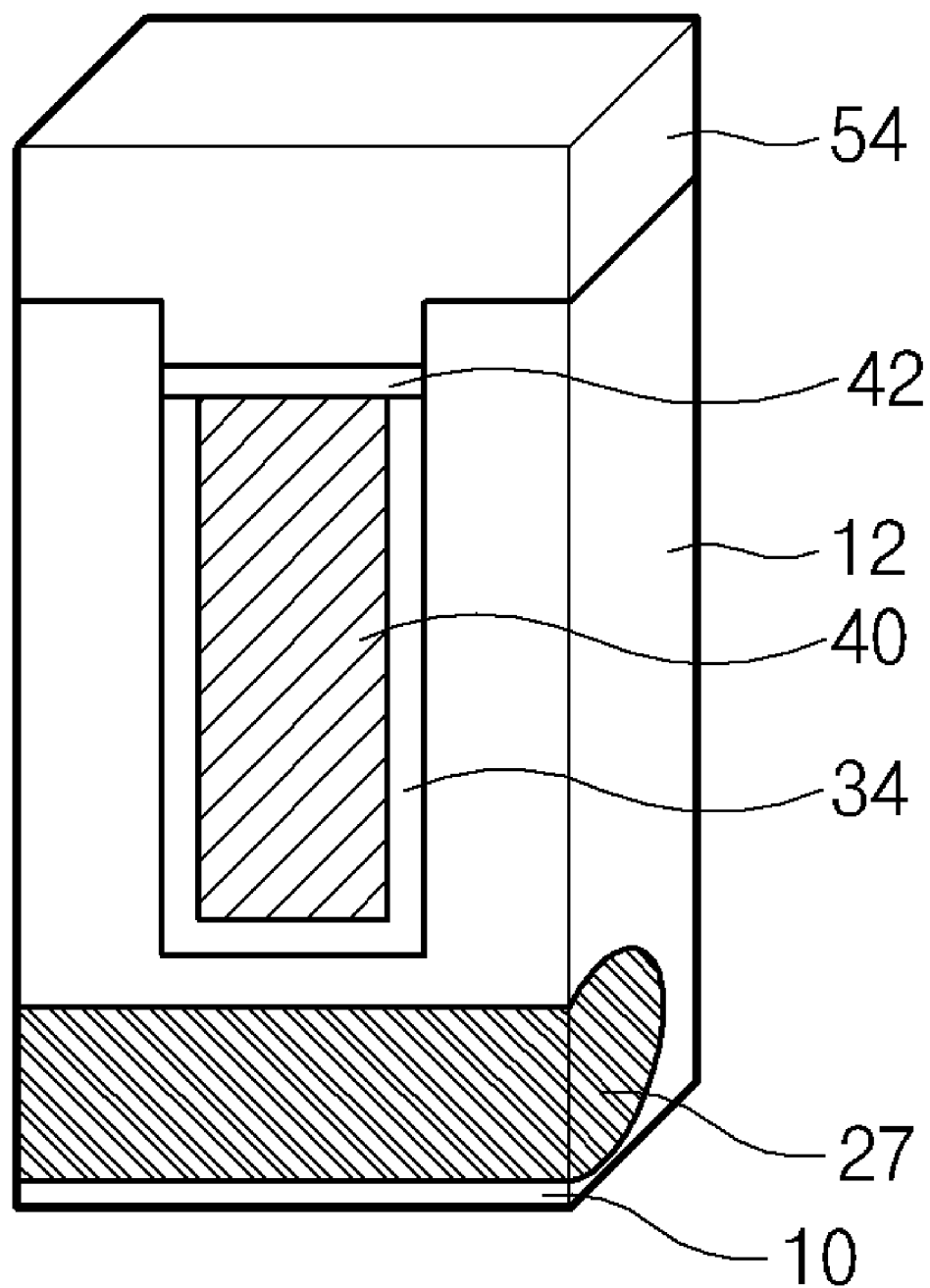

Referring to FIG. 6, it is possible to form the storage node contact 54 over the upper portion of the active region 12 and the word line 40. In the embodiment illustrated in FIGS. 1 and 2, the lower storage electrode 50 of the capacitor is formed over the upper portion of the word line 40 and the second insulating film 42. However, if necessary, the cell operation is not affected even when a storage node contact 54 is formed in such a shape as shown in FIG. 6. The storage node contact 54 includes a conductive material such as polysilicon or a metal film.

Figure 7:
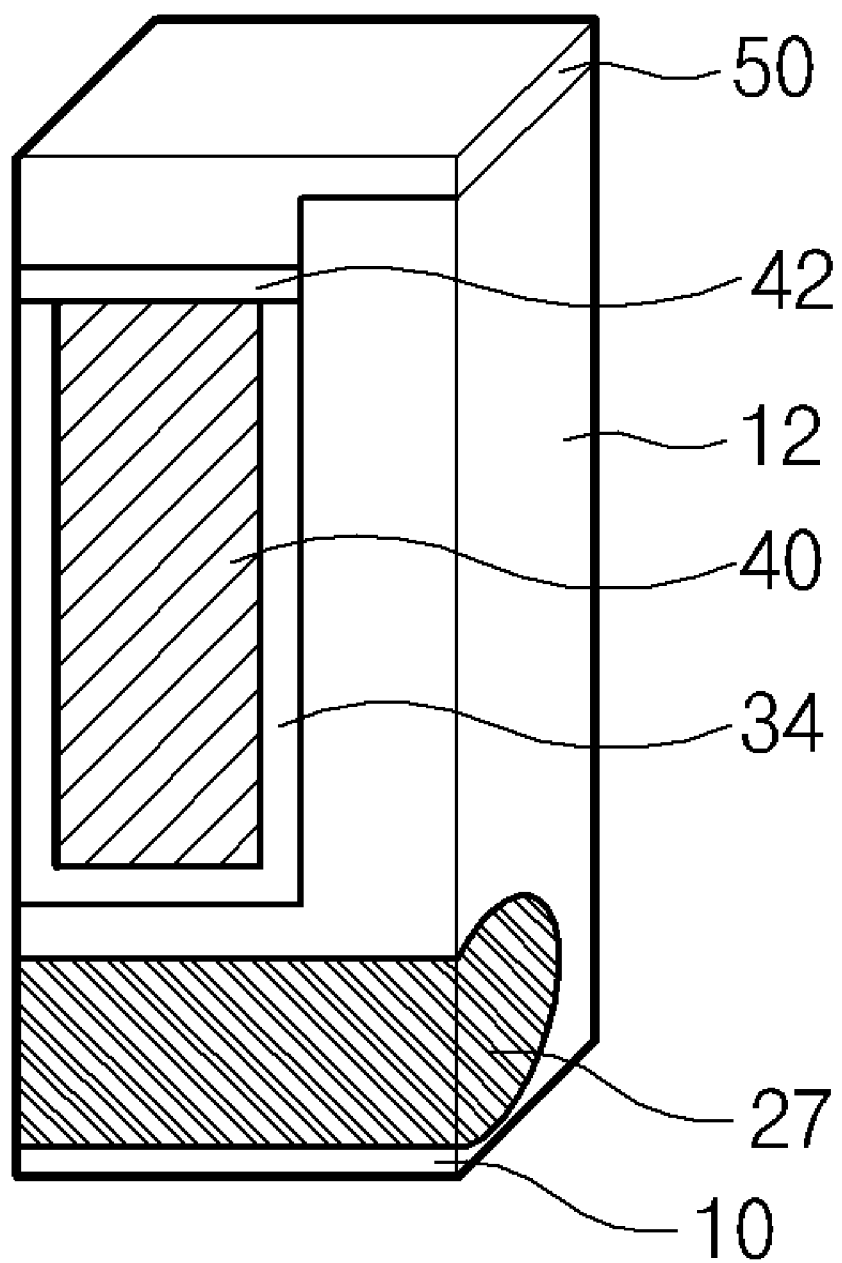

Referring to the embodiment illustrated in FIGS. 1 and 2, the word line 40 is buried in the middle part of the active region 12 in order to form a channel in the active region 12 along the left and right sidewall of the word line. In other embodiments, the word line 40 may be formed as shown in FIG. 7 so that a channel is formed along the one sidewall only of the word line 40.

Figure 8:
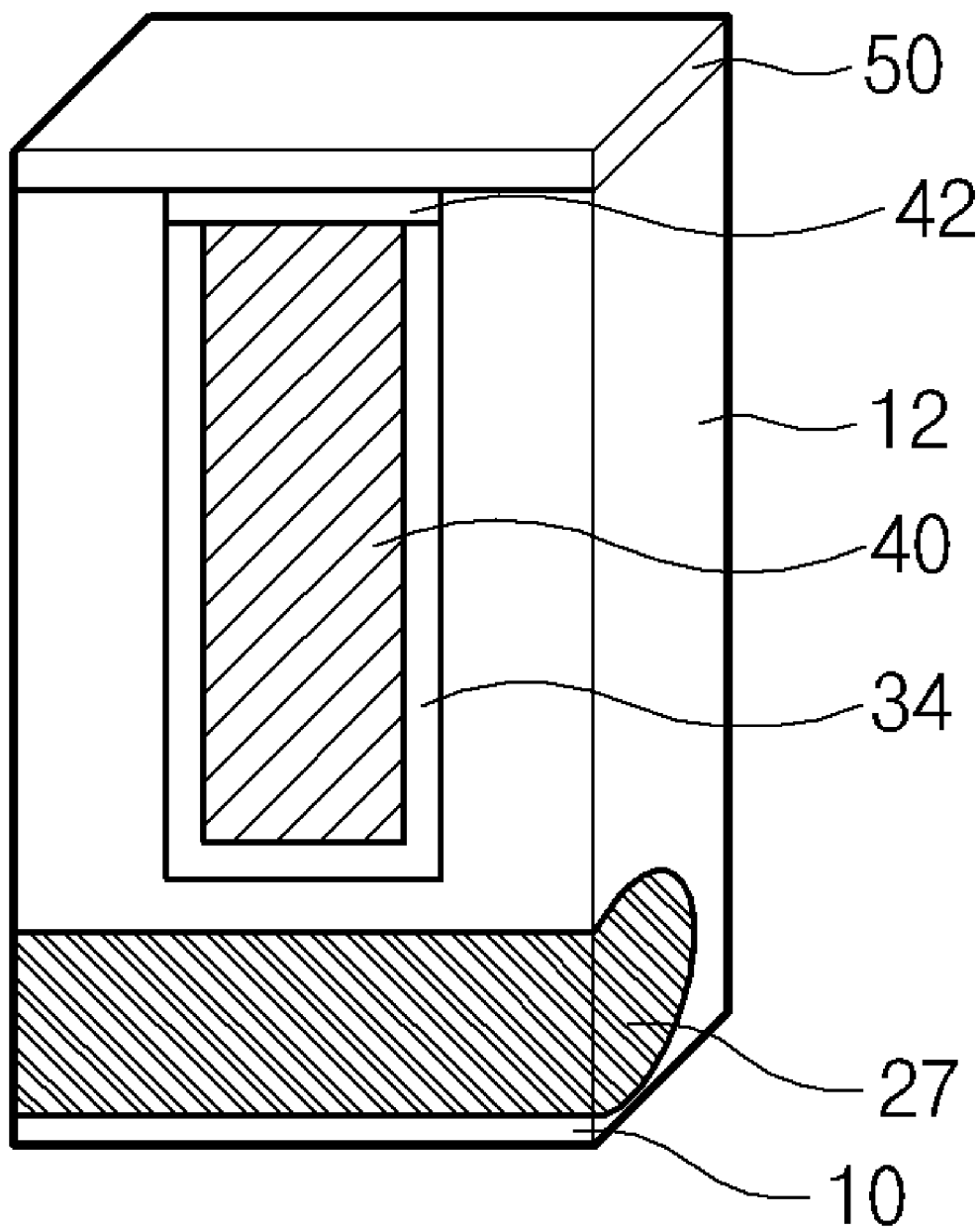

In the embodiment illustrated in FIGS. 1 and 2, the upper side end portion of the word line 40 is formed lower than the upper side end portion of the active region 12, thereby enlarging the contact area of the active region 12 with the lower electrode 50. However, even when the upper side end portion of the word line 40 is formed at a substantially identical level to the upper side end portion of the active region 12 as shown in FIG. 8, the active region 12 and the lower electrode 50 are still in contact with each other, thereby making the transistor properly operable. In case the upper portion of the word line 40 material is recessed by the process shown in FIG. 3m using a CMP or an etch-back process, the word line insulating film 34 also can be subject to an etch to be at a substantially same level as the recessed word line 40.

Figure 9:
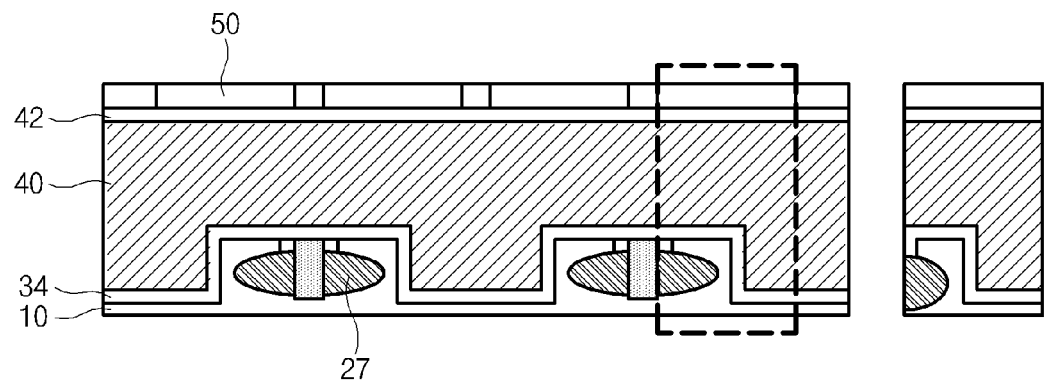
Figure 9:
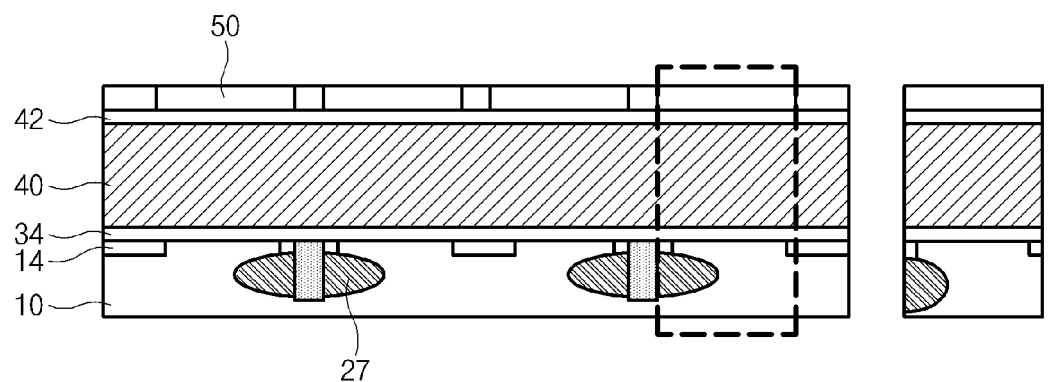

In the embodiment shown in FIGS. 1 and 2, the bottom of the word line 40 is formed to have a step difference as shown in FIG. 3j or 3i, thereby enlarging the area where the word line 40 and the active region 12 are in contact to maximize the channel area (see (a) of FIG. 9). As shown in (b) of FIG. 9, however, the operation of the transistor is intact although the lower portion of the word line 40 is formed flat with no step difference.

Figure 10:
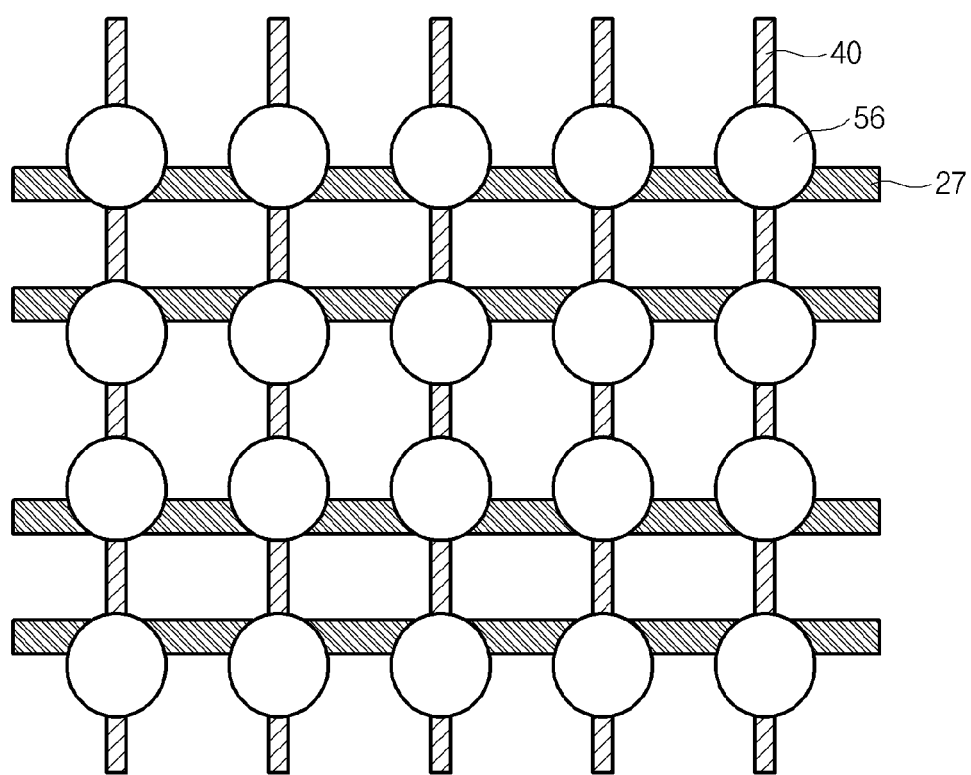
FIG. 10 is illustrating a semiconductor device including a vertical transistor according to an embodiment of the present invention.

FIG. 10 is a plan view illustrating a semiconductor device including a vertical transistor according to an embodiment of the present invention. Referring to FIG. 10, one word line 40 is electrically coupled with one bit line 27 in each cell having one capacitor 56, thereby resulting in a 4F2 layout where a channel of the transistor is vertically formed.

As described above, a semiconductor device including a vertical transistor and a method for manufacturing the same according to an embodiment of the present invention may reduce a unit cell area in comparison with a conventional layout of 8F2 and 6F2. Also, the method does not require a bit line contact, a storage node contact or a landing plug to be formed, thereby reducing the number of process steps.

The above embodiments of the present invention are illustrative and not limitative. Various alternatives and equivalents are possible. The invention is not limited by the type of deposition, etching, polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device including a vertical transistor, the method comprising:
    forming an active region in a semiconductor substrate;
    forming a bit line in a lower portion of the active region;
    forming a word line below an upper surface of the active region, the word line being formed inside of the active region or formed penetrating the active region; and
    forming a capacitor over an upper portion of the active region and the word line, the capacitor being coupled to the bit line via the active region.

2. The method according to claim 1, wherein the forming the word line in the active region includes:
    etching the semiconductor substrate including the active region so as to have a step difference.

3. The method according to claim 1, wherein the word line is formed to have a rectangular or oval cross-sectional shape.

4. The method according to claim 1, wherein the forming the active region in the semiconductor substrate includes:
    etching the active region so as to have a rectangular pillar shape or a cylindrical column shape.

5. The method according to claim 1, further comprising:
    forming a storage node contact over the upper portion of the active region and the word line.

6. The method according to claim 1, wherein the forming the word line in the active region includes:
    etching a middle part or one sidewall region of the active region; and
    burying a word line material in the etched active region.

7. The method according to claim 1, wherein the forming the word line in the active region includes:
    etching a portion of the active region;
    burying a word line material in the etched active region; and
    etching the buried word line material so that an upper side end portion of the word line extends to a level lower than an upper side end portion of the active region.

8. The method according to claim 1, the method further comprising forming a second insulating film between the word line and the capacitor.

9. The method according to claim 1, wherein the word line is formed along a direction perpendicular to the bit line.

10. The method according to claim 1, the method further comprising forming a first insulating film between neighboring active regions.

11. The method according to claim 1, the method further comprising forming a word line insulating film including an oxide film between the active region and the word line.

12. The method according to claim 1, wherein the forming the bit line in the lower portion of the active region includes:
    forming a protective film over the active region
    forming a sacrificial film over the protective film;
    patterning the protective film and the sacrificial film between the active regions to form a first recess;
    patterning a lower portion of the first recess to form a bulb-like recess extended from the first recess;
    filling a bit line material in the bulb-like recess to form a bulb-like bit line;
    forming a second recess passing through the bulb-like bit line so that the recess forms two electrically separated bit lines; and
    filling a first insulating film in the second recess.

13. The method of claim 1,
    wherein the capacitor is formed directly over the word line so that the capacitor overlaps with an upper surface of the word line.

14. A method for manufacturing a semiconductor device including a vertical transistor, the method comprising:
    forming an active region in a semiconductor substrate;
    forming a bit line recess in a lower portion of the active region;
    enlarging a lower portion of the bit line recess to form a bulb-like recess extended laterally from the bit line recess;
    filling a bit line material in the bulb-like recess to foam a bulb-like bit line;
    forming a word line below an upper surface of the active region; and
    forming a capacitor over an upper portion of the active region and the word line, the capacitor being coupled to the bit line via the active region.

15. The method of claim 14, the method further comprising:
    splitting the bulb-like bit line into two separate bit line patterns,
    wherein the capacitor is coupled to one of the two separate bit line patterns via the active region.

16. The method of claim 14,
    wherein the word line is formed inside of the active region or formed to penetrate the active region.

17. The method of claim 14,
    wherein the active region is in a pillar shape.

* * * * *